United States Patent
Maruyama et al.

(10) Patent No.: US 8,218,592 B2
(45) Date of Patent: Jul. 10, 2012

(54) LASER DEVICE, OPTICAL PICKUP, AND OPTICAL DISK DEVICE

(75) Inventors: Tsutomu Maruyama, Kanagawa (JP); Goro Fujita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/023,063

(22) Filed: Feb. 8, 2011

(65) Prior Publication Data

US 2011/0194391 A1 Aug. 11, 2011

(30) Foreign Application Priority Data

Feb. 10, 2010 (JP) ................................ P2010-027362

(51) Int. Cl.
*H01S 3/00* (2006.01)

(52) U.S. Cl. ................ 372/38.07; 372/38.02; 372/38.08

(58) Field of Classification Search ............. 372/29.015, 372/38.02, 38.04, 38.07, 38.08
See application file for complete search history.

(56) References Cited

U.S. PATENT DOCUMENTS

| 4,918,396 A * | 4/1990 | Halemane et al. ............. 359/333 |
| 2002/0048012 A1 * | 4/2002 | Stann ........................... 356/5.09 |

FOREIGN PATENT DOCUMENTS

JP 4465167 2/2010

* cited by examiner

*Primary Examiner* — Armando Rodriguez
(74) *Attorney, Agent, or Firm* — K&L Gates LLP

(57) ABSTRACT

A laser device includes a semiconductor laser, a signal generating circuit generating a pulse signal for driving the semiconductor laser, an amplifying circuit amplifying the pulse signal, and a control circuit unit provided between the amplifying circuit and the semiconductor laser and controlling the pulse signal by letting alternating-current components of the pulse signal pass through and removing at least part of direct-current components of the pulse signal.

3 Claims, 8 Drawing Sheets

LASER DEVICE, OPTICAL PICKUP, AND OPTICAL DISK DEVICE

CROSS REFERENCES TO RELATED APPLICATIONS

The present application claims priority to Japanese Priority Patent Application JP 2010-027362 filed in the Japan Patent Office on Feb. 10, 2010, the entire contents of which is hereby incorporated by reference.

BACKGROUND

The present application relates to a laser device using a semiconductor laser. Also, the present application relates to an optical pickup and optical disk device including this laser device.

As optical information recording media, disk-like optical information recording media (optical disks) have been widely available in the related art.

In general, a compact disc (CD), a digital versatile disc (DVD), a Blu-ray Disc®, and others have been used.

On the other hand, an optical disk device supporting the optical information recording medium is configured to record various contents, such as music contents and video contents, and various types of information, such as various data for computer, in the optical information recording medium.

In particular, in recent years, the amount of information is increased due to, for example, increased definition of video and increased sound quality of music. Also, an increase of the number of contents to be recorded in one optical information recording medium has been demanded. Therefore, a further increase of the capacity of the optical information recording medium has been demanded.

To this end, an optical information recording medium has been suggested that is configured to three-dimensionally record information in a thickness direction of the optical information recording medium by using a material forming a record pit by causing a two-photon absorption reaction in response to light (for example, refer to Japanese Unexamined Patent Application Publication No. 2005-37658).

With this structure, the capacity of the optical information recording medium can be increased.

Meanwhile, since this two-photon absorption reaction is a phenomenon only occurring in response to light having a large light intensity, a light source having a large intensity of emitted light is preferably used.

Examples of a light source having a large intensity of emitted light include short-pulse light sources, such as so-called picosecond lasers and femtosecond lasers, that output laser light of a short pulse, typified by titanium-sapphire lasers and YAG lasers.

However, since these short-pulse light sources can output short pulses by an operation of an optical component provided outside of a light generator, the size of these light sources is generally large, and their price is also high.

Therefore, it may be impractical to mount a short-pulse light source on an optical disk device.

SUMMARY

A semiconductor laser is an example of a small-sized light generator generally used in an optical disk device.

If a pulse of laser light can be output directly from this semiconductor laser, an optical component to be provided outside of the light generator can be dispensed with. Therefore, it may be possible to significantly decrease the size of the short-pulse light source.

However, in order to cause laser light of a short pulse to be generated from the semiconductor laser, an extremely high voltage is applied to the semiconductor laser within a short time. For this reason, a driving pulse signal is amplified by a wide-band RF amplifier or the like.

Normally, an output impedance of the RF amplifier has a characteristic impedance set at 50Ω, with its output being subjected to AC coupling.

On the other hand, the semiconductor laser has a characteristic impedance being high in an OFF state and being low in an ON state. Thus, at the time of pulse application, the impedance is sharply changed. For this reason, an offset occurs in the average value of a driving pulse waveform.

If an offset occurs in the average value of the driving pulse waveform in this manner, the peak voltage of a pulse applied to the semiconductor laser is decreased, falling short of a threshold voltage for generating laser light from the semiconductor laser and inhibiting the semiconductor laser to generate laser light of a short pulse.

It is desirable to provide a laser device allowing laser light of a short pulse to be generated from a semiconductor laser by controlling direct-current components of a driving pulse. It is also desirable to provide an optical pickup and optical disk device including this laser device.

A laser device of an embodiment includes a semiconductor laser, a signal generating circuit generating a pulse signal for driving the semiconductor laser, and an amplifying circuit amplifying the pulse signal. Furthermore, the laser device includes a control circuit unit provided between the amplifying circuit and the semiconductor laser and controlling the pulse signal by letting alternating-current components of the pulse signal pass through and removing at least part of direct-current components of the pulse signal.

An optical pickup of another embodiment radiates an optical recording medium with laser light to record information on the optical recording medium or reproduce information recorded on the optical recording medium. The optical pickup includes a semiconductor laser, a signal generating circuit generating a pulse signal for driving the semiconductor laser, and an amplifying circuit amplifying the pulse signal. Furthermore, the optical pickup includes a control circuit unit provided between the amplifying circuit and the semiconductor laser and controlling the pulse signal by letting alternating-current components of the pulse signal pass through and removing at least part of direct-current components of the pulse signal. That is, the optical pickup includes the structure of the laser device of the embodiment described above. Also, the optical pickup includes an objective lens gathering laser light from the semiconductor laser to radiate the optical recording medium and a light-receiving unit receiving reflected light from the optical recording medium.

An optical disk device of still another embodiment radiates an optical disk with laser light to record information on the optical disk or reproduce information recorded on the optical disk. The optical disk device includes the structure of the laser device of the embodiment described above, and an optical pickup including an objective lens gathering laser light from the semiconductor laser to radiate the optical disk and a light-receiving unit receiving reflected light from the optical disk. Furthermore, the optical disk device includes an optical disk driving unit rotating the optical disk, an optical pickup driving unit moving the optical pickup with respect to the optical disk, and a signal processing unit performing signal processing on an optical output signal from the light-receiving unit.

According to the structure of the laser device of the embodiment described above, the structure includes a control circuit unit provided between the amplifying circuit and the semiconductor laser and controlling a pulse signal by letting alternating-current components of the pulse signal pass through and removing at least part of direct-current components of the pulse signal. With this, the pulse signal is supplied to the semiconductor laser with part or all of the direct-current components of the pulse signal being removed. Therefore, with a DC offset being reduced or removed from the signal supplied to the semiconductor laser, the signal can be made as an appropriate pulse signal for allowing pulse light emission of the semiconductor laser. Therefore, the semiconductor laser can be caused to emit light with a short pulse.

According to the structure of the optical pickup of the other embodiment described above, since the structure includes the structure of the laser device of the embodiment described above, the semiconductor laser can be caused to emit light with a short pulse, and the optical recording medium can be radiated with laser light of a short pulse.

According to the structure of the optical disk device of the still other embodiment described above, since the structure includes the optical pickup including the structure of the laser device of the embodiment described above, the semiconductor laser can be caused to emit light with a short pulse, and the optical disk can be radiated with laser light of a short pulse.

According to the embodiments of the present application described above, the semiconductor laser can be caused to emit light with a short pulse. Therefore, since the pulse width is short, degradation of the semiconductor laser can be prevented even when the amplification in the amplifying circuit is increased to increase the intensity of emitted light of the semiconductor laser. With this, by using the semiconductor laser, a small-sized light source having a high intensity of emitted light can be configured.

Also, according to the structures of the optical pickup of the other embodiment and the optical disk device of the still other embodiment, the optical recording medium, such as an optical disk, can be radiated with laser light of a short pulse. Also, with the semiconductor laser, a small-sized light source having a high intensity of emitted light can be configured.

With this, the capacity of an optical recording medium, such as an optical disk, can be increased, with the optical recording medium being configured so as to three-dimensionally record information in a thickness direction.

Additional features and advantages are described herein, and will be apparent from the following Detailed Description and the figures.

DETAILED DESCRIPTION

Embodiments of the present application will be described below in detail with reference to the drawings.

Figure 1:
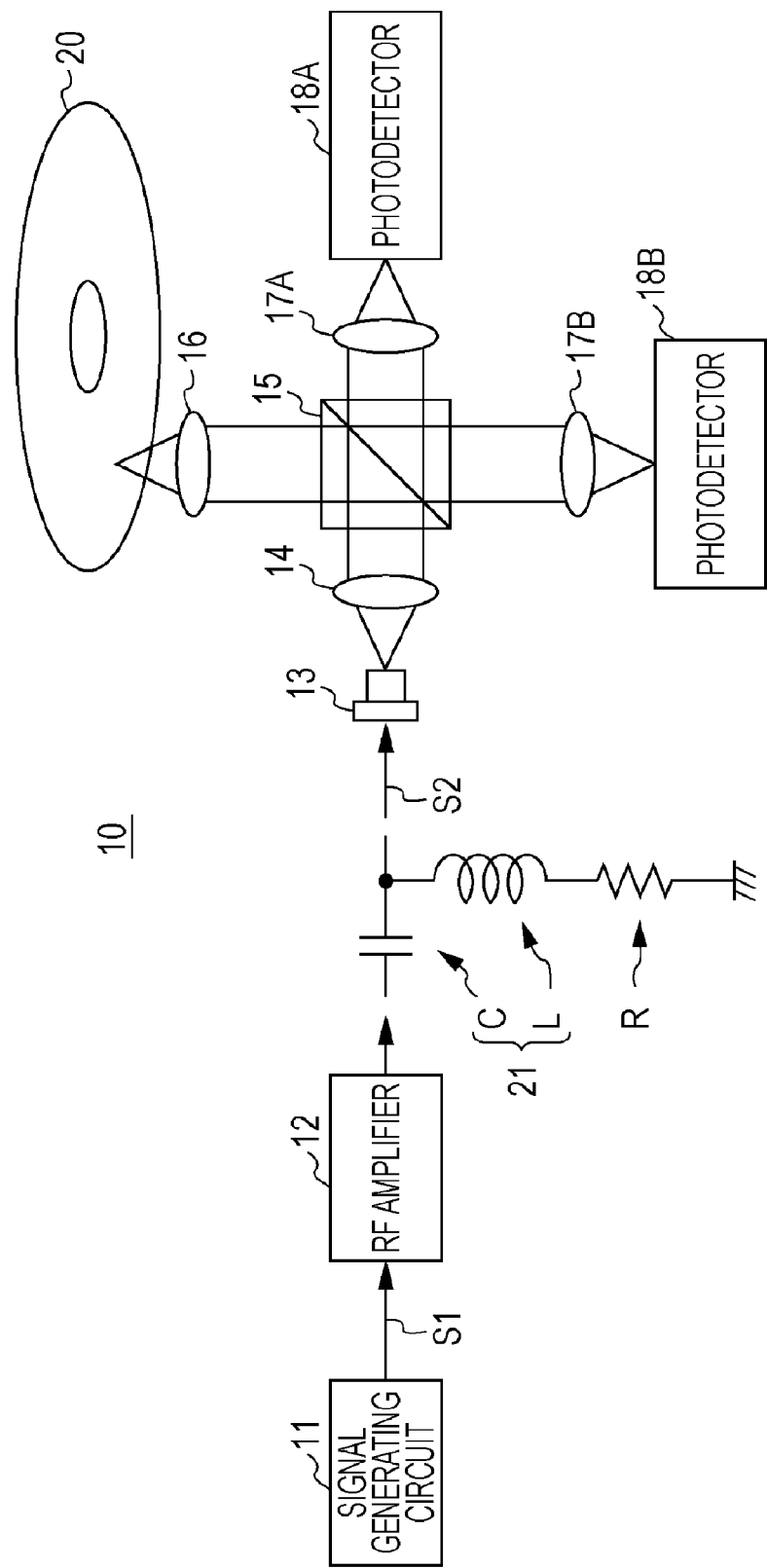
FIG. 1 is a schematic structural diagram (block diagram) of an optical pickup of an embodiment.

Here, description is made according to the following sequence.
1. Embodiment
2. Another Embodiment
3. Modification Example
4. Still Another Embodiment
5. Measurement of Characteristics 1. Embodiment A schematic structural diagram (block diagram) of an optical pickup of an embodiment is depicted in FIG. 1.

This optical pickup 10 includes a signal generating circuit 11, an RF amplifier 12, a semiconductor laser 13, a collimator lens 14, a beam splitter 15, objective lenses 16, 17A, and 17B, and first and second photodetectors 18A and 18B.

Also, this optical pickup 10 radiates an optical disk 20 with laser light to record information on the optical disk 20 and reproduce information recorded on the optical disk 20.

The signal generating circuit 11 generates a short-pulse signal S1 for driving the semiconductor laser 13 to cause laser light to be emitted from the semiconductor laser 13.

This short-pulse signal S1 is preferably assumed to be a pulse signal having a pulse width of several nanoseconds (for example, one nanosecond) and having a repetition frequency of 10 to 200 MHz.

The RF amplifier 12 amplifies the amplitude of the short-pulse signal S1 generated in the signal generating circuit 11. For example, amplification is made on the order of 40 to 50 V and on the order of 30 dB.

As this RF amplifier 12, for example, ALM 00110 manufactured by R&K Company Limited can be used.

Here, a characteristic impedance of the termination of the RF amplifier 12 is normally designed to be at 50Ω for impedance matching with load.

As the semiconductor laser 13, a semiconductor laser emitting laser light having a predetermined wavelength band is used so as to support the type of the optical disk 20 for which the optical pickup 10 performs recording and reproduction.

The collimator lens 14 makes laser light emitted from the semiconductor laser 13 as parallel light.

The beam splitter 15 separates laser light from the semiconductor laser 13 into light toward the optical disk 20 and light toward the first photodetector 18A.

The objective lens 16 focuses laser light from the semiconductor laser 13 for radiation onto the optical disk 20.

The objective lens 17A and the first photodetector 18A are components for monitoring light emitted from the semiconductor laser 13.

The objective lens 17B and the second photodetector 18B are components for detecting reflected light reflected on the optical disk 20.

As each of the first photodetector 18A and the second photodetector 18B, a light-receiving element including a photodiode formed with a semiconductor layer can be used.

Furthermore, this optical pickup 10 includes a control circuit unit 21 provided between the RF amplifier 12 and the semiconductor laser 13 to control a pulse signal.

This control circuit unit 21 has a capacitor C connected in series to the RF amplifier 12 and the semiconductor laser 13 and a coil L with one end connected to a semiconductor laser 13 side of the capacitor C. The other end of the coil L is connected to a ground potential GND via a resistor R. Therefore, the other end of the coil L has a potential corresponding to the resistance value of the resistor R.

In this control circuit unit 21, with the operation of the circuit to which the capacitor C and the coil L are connected, alternating-current components of the pulse signal pass through but at least part of (part or all of) direct-current components of the pulse signal is removed.

With this, the direct-current components of the short-pulse signal S1 amplified by the RF amplifier 12 is changed by the control circuit unit 21. Therefore, a DC offset in a laser driving signal S2 supplied to the semiconductor laser 13 can be reduced or removed.

When the control circuit unit 21 is configured so that all of the direct-current components of the pulse signal are removed, a DC offset in the laser driving signal S2 can be removed to control the average value of the laser driving signal S2 at 0.

Also, with the values of the capacity of the capacitance C and the inductance of the coil L of the control circuit unit 21, the degree of removal of the alternating-current components of the pulse signal can be changed.

The optical pickup 10 depicted in FIG. 1 operates as described below, for example.

By the signal generating circuit 11, the short-pulse signal S1 is generated, such as a pulse signal, for example, having a pulse width of several nanoseconds (for example, one nanosecond), and having a repetition frequency of 10 to 200 MHz.

The short-pulse signal S1 generated in the signal generating circuit 11 is amplified by the RF amplifier 12 so as to have an amplitude to such a degree that a short pulse causes light emission from the semiconductor laser 13.

The short-pulse signal S1 amplified by the RF amplifier 12 have part or all of direct-current components removed by the control circuit unit 21, thereby causing a DC offset to be reduced or removed. With this, the laser driving signal S2 with a DC offset reduced or removed is supplied to the semiconductor laser 13. With a DC offset in the laser driving signal S2 reduced or removed, short-pulse light approximately 10 picoseconds is emitted from the semiconductor laser 13.

The short-pulse light output from the semiconductor laser 13 goes through the collimator lens 14 to become parallel light, and light for monitoring is partially branched by the beam splitter 15 to cause the remaining light to go toward the optical disk 20. Light passing through the beam splitter 15 is gathered by the objective lens 17A and received by the first photodetector 18A for monitoring. Light reflected on the beam splitter 15 is gathered by the objective lens 16 for radiation of the optical disk 20.

Reflected light reflected on the optical disk 20 passes through the beam splitter 15 to be gathered by the objective lens 7B and received by the second photodetector 18B.

According to the structure of the optical pickup 10 of the embodiment described above, the control circuit unit 21 formed of the capacitor C and the coil L is provided between the RF amplifier 12 amplifying the short-pulse signal S1 generated in the signal generating circuit 11 and the semiconductor laser 13. The control circuit unit 21 is configured in a manner such that the capacitor C is connected in series to the RF amplifier 12 and the semiconductor laser 13 and the coil L is connected to one end of the capacitor C and the resistor R connected to the ground potential.

With this, by the control circuit unit 21, the alternating-current components of the short-pulse signal S1 can be let pass through and part or all of the direct-current components thereof can be removed. Therefore, a DC offset in the laser driving signal S2 supplied to the semiconductor laser 13 can be reduced or removed.

Therefore, the laser driving signal S2 can be made as an appropriate pulse signal for allowing short-pulse light emission of the semiconductor laser 13.

The semiconductor laser 13 can be caused to perform short-pulse light emission. Therefore, since the pulse width is short, degradation of the semiconductor laser 13 can be prevented even when the amplification in the RF amplifier 12 is increased to increase the intensity of emitted light of the semiconductor laser 13. With this, by using the semiconductor laser 13, a small-sized light source having a high intensity of emitted light can be configured.

Also, since a small-sized light source having a high intensity of emitted light can be configured in this manner, as described above, the capacity of the optical disk 20 can be increased, with the optical disk 20 being configured so as to three-dimensionally record information in a thickness direction.

2. Another Embodiment

Figure 2:
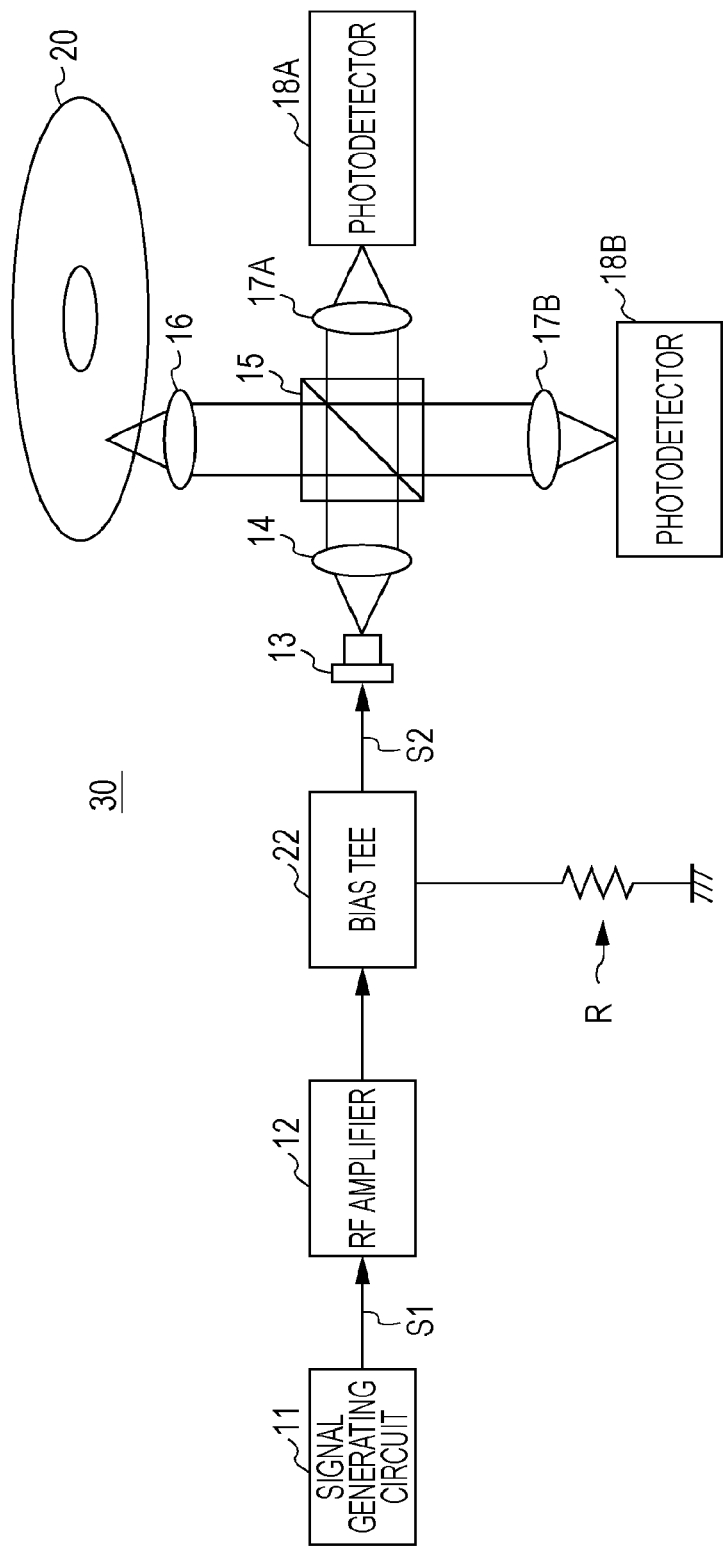
FIG. 2 is a schematic structural diagram (block diagram) of an optical pickup of another embodiment.

A schematic structural diagram (block diagram) of an optical pickup of another embodiment is depicted in FIG. 2.

This optical pickup 30 includes a bias tee 22 provided between an RF amplifier 12 and a semiconductor laser 13 as a control circuit unit controlling a pulse signal.

The bias tee 22 is configured to include a capacitor, a coil, and others and, as with the control circuit unit 21 of the embodiment described first, can let alternating-current components of the pulse signal pass through and can remove at least part of (part or all of) direct-current components of the pulse signal.

As the bias tee 22, a commercially-available bias tee can be used. Also, a bias tee with specifications satisfying conditions for the control circuit unit of this optical pickup 30 is used.

Since the other structure is similar to that of the optical pickup 10 of the embodiment described first, the same reference numerals and symbols are provided and redundant description is omitted.

According to the structure of the optical pickup 30 of the other embodiment described above, the bias tee 22 is provided as a control circuit unit between the RF amplifier 12 amplifying the short pulse signal S1 occurring in the signal generating circuit 11, and the semiconductor laser 13.

With this, by the control circuit unit, alternating-current components of the short pulse signal S1 can be let pass through and part or all of direct-current components thereof can be removed. Therefore, a DC offset in the laser driving signal S2 supplied to the semiconductor laser 13 can be reduced or removed.

Therefore, the laser driving signal S2 can be made as an appropriate pulse signal, allowing short-pulse light emission of the semiconductor laser 13.

The semiconductor laser 13 can be caused to perform short-pulse light emission. Therefore, since the pulse width is short, degradation of the semiconductor laser 13 can be prevented even when the amplification in the RF amplifier 12 is increased to increase the intensity of emitted light of the semiconductor laser 13. With this, by using the semiconductor laser 13, a small-sized light source having a high intensity of emitted light can be configured.

Also, since a small-sized light source having a high intensity of emitted light can be configured in this manner, as described above, the capacity of the optical disk 20 can be increased, with the optical disk 20 being configured so as to three-dimensionally record information in a thickness direction.

3. Modification Example

In the other embodiment depicted in FIG. 2, the control circuit unit (the bias tee 22) removing a DC offset is connected to the ground potential GND via the resistor R.

Figure 3:
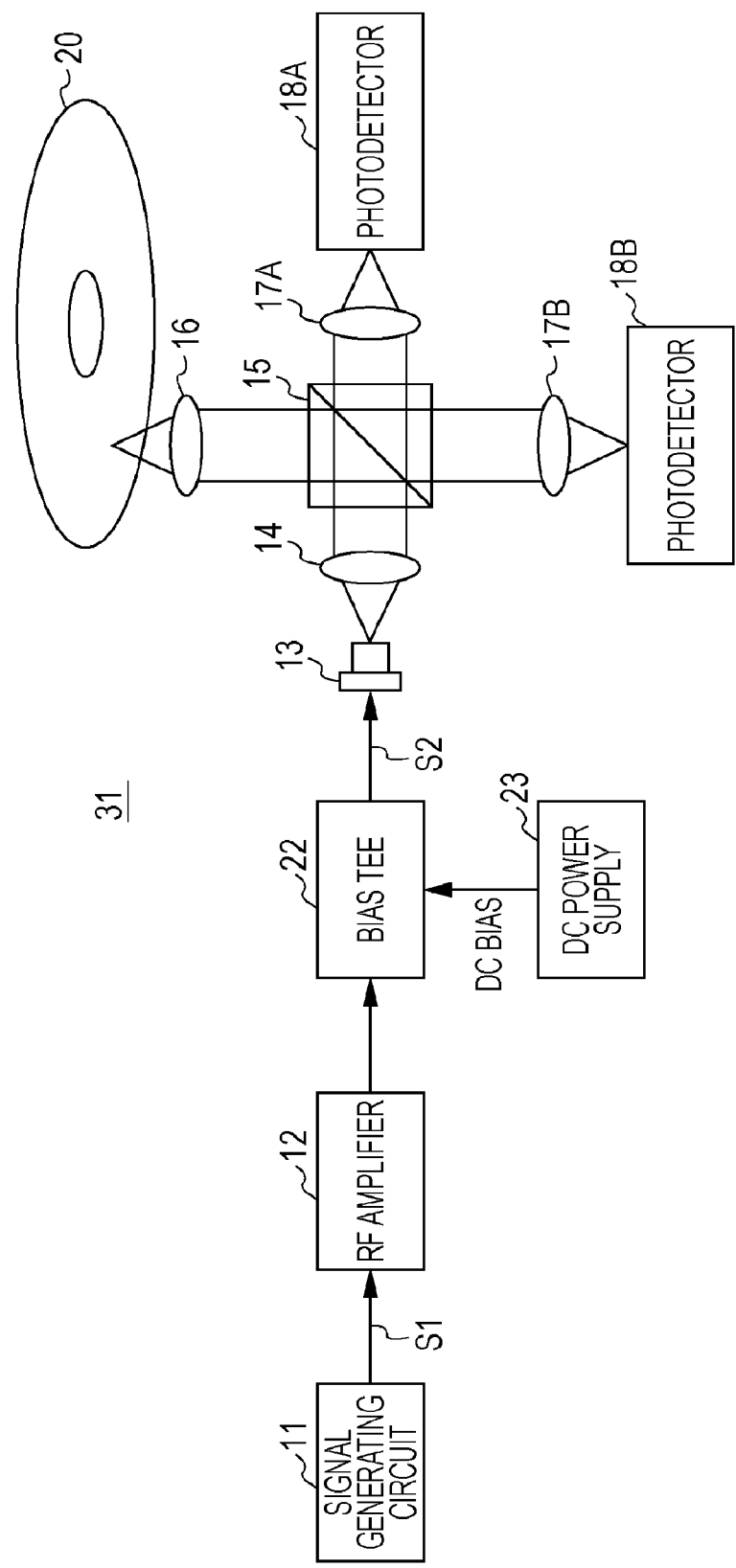
FIG. 3 is a schematic structural diagram (block diagram) of an optical pickup of a modification example of the other embodiment.

On the other hand, as a modification example, a schematic structural diagram (block diagram) of an optical pickup is depicted in FIG. 3.

In an optical pickup 31 depicted in FIG. 3, in place of the structure of the optical pickup 30 of the other embodiment depicted in FIG. 2 in which the control circuit unit (the bias tee 22) is connected to the ground potential GND, the control circuit unit is coupled to a DC power supply 23, which is a direct-current power supply unit.

With this structure, with the DC power supply 23, a direct-current bias voltage can be applied from outside to the control circuit unit (the bias tee 22).

Also, by coupling the control circuit unit to the DC power supply 23, the level of the average value of the laser driving signal S2, which is controlled by the control circuit unit, can be set according to the voltage to be applied from the DC power supply 23.

For example, when the DC power supply 23 is assumed to be a variable power supply, the level of the average value of the laser driving signal S2 can also be controlled at an arbitrary value.

With this, the peak voltage of the laser driving signal S2 to be supplied to the semiconductor laser 13 can be further increased. Therefore, even when the amplitude of the laser driving signal S2 is decreased, the semiconductor laser 13 can be caused to emit light.

However, when the level of the average value of the laser driving signal S2 exceeds a level at which normal light emission occurs, the semiconductor laser 13 typically emits light, and the light-emission efficiency of the semiconductor laser 13 is degraded. To get around this, the level of the average value of the laser driving signal S2 is controlled so as not to exceed the level at which the semiconductor laser 13 emits light.

FIG. 3 depicts the structure in which the DC power supply 23 is connected to the control circuit unit (the bias tee 22) of the other embodiment.

Similarly, the structure can be such that a DC power supply is connected to the control circuit unit (the capacitor C and the coil L) 21 of the embodiment described first.

In each of the embodiments described above, the structure is such that the optical disk is radiated with laser light from the semiconductor laser.

In the embodiments of the present application, the optical recording medium that irradiates with laser light is not restricted to a disk-like optical disk but can be an optical recording medium of another shape, such as a card-like optical recording medium, as long as the optical recording medium records and reproduces information with light.

In each of the embodiments described above, the reflected light from the optical disk 20 is received by the photodetector. In the embodiments of the present application, the light-receiving unit receiving the reflected light from the optical recording medium, such as an optical disk, is not meant to be restricted to a photodetector, and a light-receiving element of another structure may be used as a light-receiving unit.

Also, in the embodiments of the present application, the amplifying circuit amplifying the pulse signal is not meant to be restricted to the RF amplifier 12 of each of the embodiments described above, and an amplifying circuit of another structure may be used.

By using the optical pickups 10, 30, and 31 of each of the embodiments and the modification example described above, an optical disk device recording and reproducing information on and from the optical disk 20 can be configured.

Specific examples of the optical disk device include an integrated optical disk drive in various electronics, such as a personal computer, a videocassette recorder, or a video camera, and a discrete optical disk drive.

The optical disk device is configured to include, in addition to an optical pickup, an optical disk driving unit rotating an optical disk, an optical pickup driving unit moving the optical pickup with respect to the optical disk, a signal processing unit performing signal processing on an optical output signal from a photodetector or the like, and others.

An example of the optical disk driving unit is a spindle motor. An example of the optical pickup driving unit is a thread motor.

4. Still Another Embodiment

Figure 4:
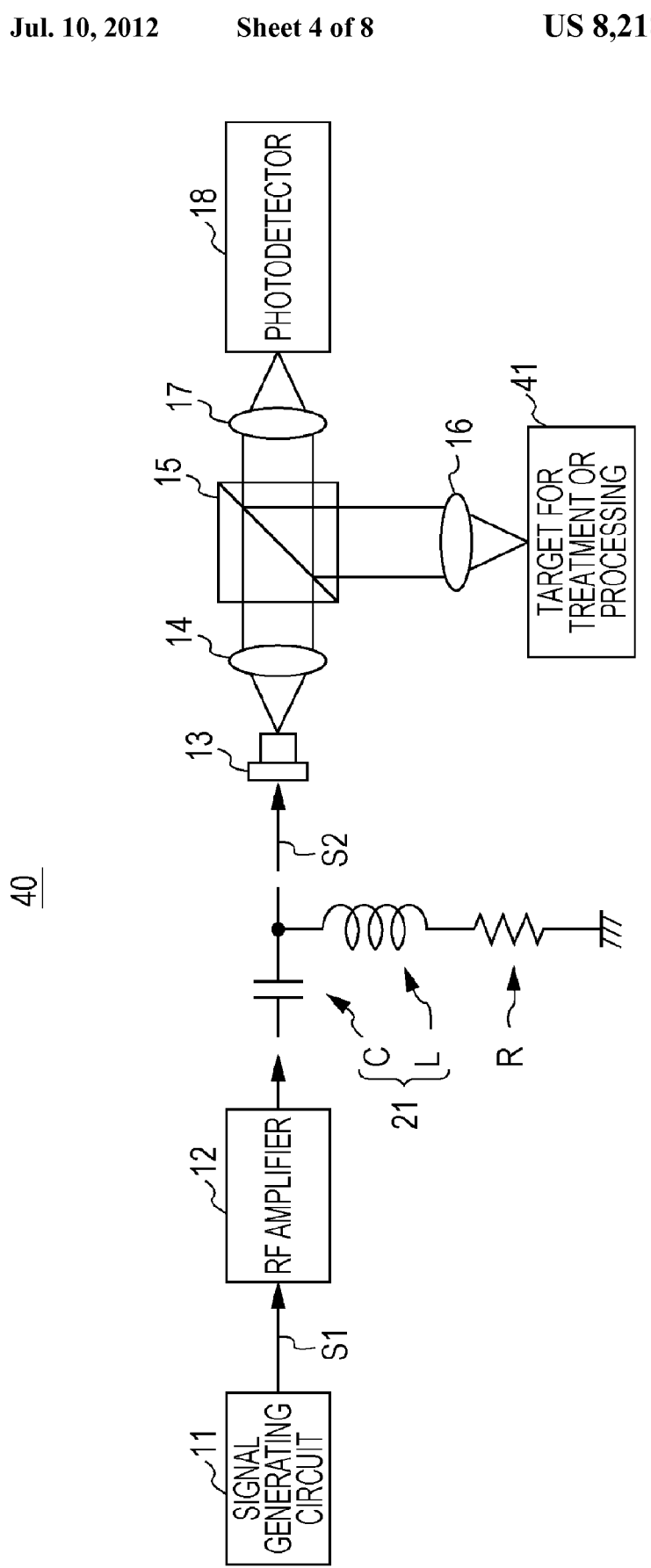
FIG. 4 is a schematic structural diagram (block diagram) of a laser device of still another embodiment.

A schematic structural diagram (block diagram) of a laser device of a still another embodiment is depicted in FIG. 4.

A laser device 40 depicted in FIG. 4 is suitable as being applied to a laser treatment device or a laser processing device.

This laser device 40 radiates a target for treatment or processing 41 with laser light emitted from a semiconductor laser 13 and made by a collimator lens 14 as parallel light.

In this laser device 40, since reflected light from the target does not occur, a monitoring objective lens 17 and a photodetector 18 are provided only.

The other structure is similar to that of the optical pickup 10 of the embodiment described first.

According to the structure of the laser device 40 of the still other embodiment described above, a control circuit unit 21 having a structure similar to that of the optical pickup 10 of the embodiment described first is provided between the RF amplifier 12 amplifying a short-pulse signal S1 generated in a signal generating circuit 11 and the semiconductor laser 13.

With this, by the control circuit unit 21, alternating-current components of the short-pulse signal S1 can be let pass through, and part or all of direct-current components thereof can be removed. Therefore, a DC offset in a laser driving signal S2 supplied to the semiconductor laser 13 can be reduced or removed.

Therefore, with the laser driving signal S2 being set as an appropriate pulse signal, the semiconductor laser 13 can be caused to perform short-pulse light emission.

The semiconductor laser 13 can be caused to perform short-pulse light emission. Therefore, since the pulse width is short, degradation of the semiconductor laser 13 can be prevented even when the amplification in the RF amplifier 12 is increased to increase the intensity of emitted light of the semiconductor laser 13.

Also, since the pulse width is short, only a part of the target for treatment or processing 41 radiated with laser light and its close vicinity can be heated. Therefore, treatment or processing can be performed with less damage on the target for treatment or processing 41.

Here, it is also possible to apply the control circuit unit implemented by the bias tee or the supply of a direct-current voltage externally from a DC power supply to the control circuit unit, as shown in FIG. 2 or 3, to the structure of the laser device 40 depicted in FIG. 4.

5. Measurement of Characteristics

Next described are the results obtained by fabricating a laser device of the structure of the embodiments of the present application and studying the state of a laser driving signal and the state of light emitted from the semiconductor laser.

Figure 5:
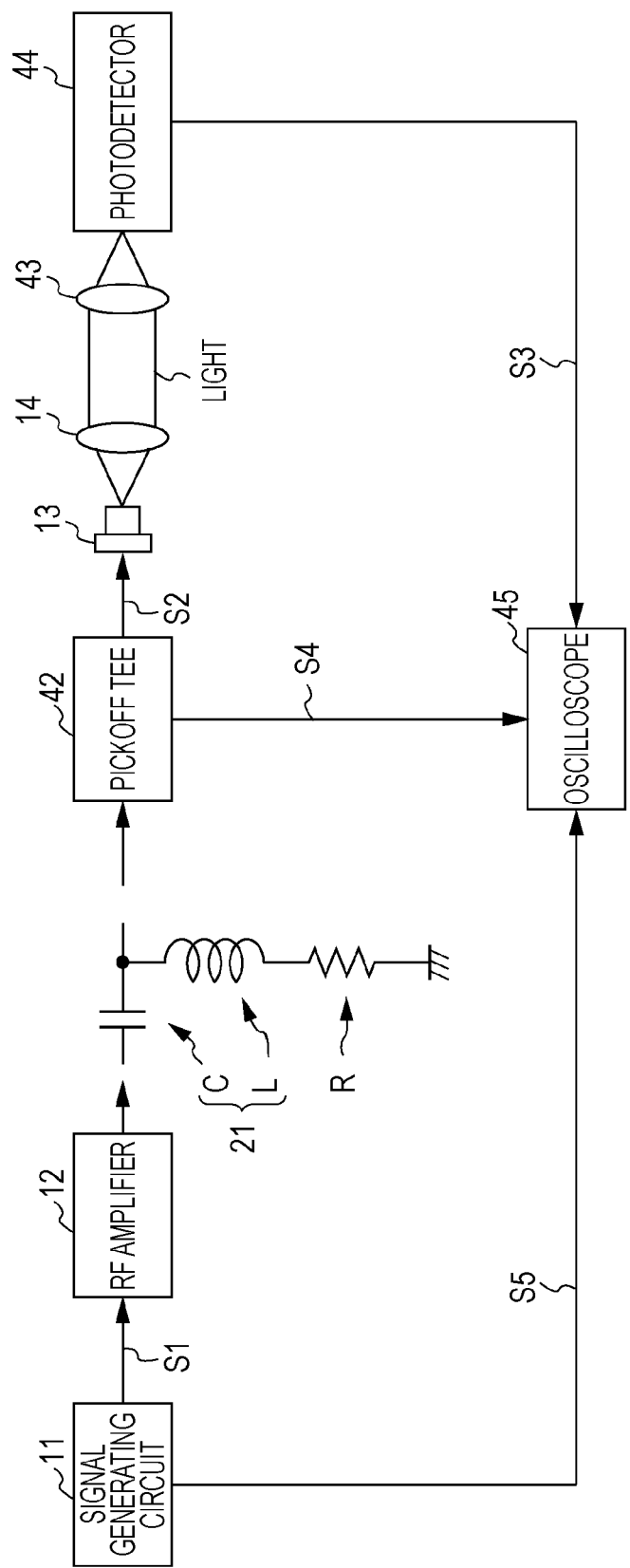
FIG. 5 is a schematic structural diagram (block diagram) of a laser device whose characteristics were measured.

A schematic structural diagram (block diagram) of the fabricated laser device is depicted in FIG. 5.

In the laser device depicted in FIG. 5, a different structure in comparison with the optical pickup 10 of FIG. 1 is as follows.

An objective lens 43 and a photodetector 44 are provided at the subsequent stage of the collimator lens 14. Also, a pickoff tee 42 is provided between a control circuit unit 21 and a semiconductor laser 13, and an oscilloscope 45 is provided as being connected to a line branched at this pickoff tee 42.

The pickoff tee 42 extracts part of a laser driving signal S2 with an output of −20 dB, and takes the extracted signal as a monitor signal S4.

By the photodetector 44, light is received and detected, and the light is converted to an electrical signal for output as an optical output signal S3.

Also, the oscilloscope 45 is supplied with the optical output signal S3 detected by the photodetector 44, the monitor signal S4 extracted by the pickoff tee 42, and a marker signal S5 from the signal generating circuit 11. The marker signal S5 is synchronized with the short-pulse signal S1, and is used as a trigger signal at the time of waveform observation in the oscilloscope 45.

Figure 6:
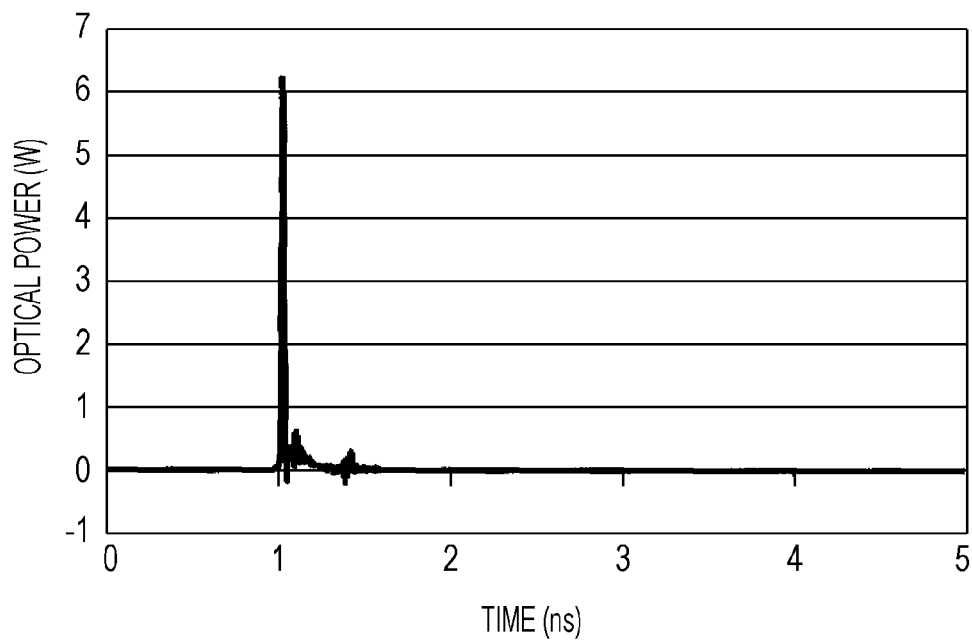
FIG. 6 is a graph depicting an example of a light-emitting waveform of a semiconductor laser of FIG. 5.

Here, in the laser device of FIG. 5, light emission waveforms of the semiconductor laser 13 were studied. An example of the obtained light-emission waveforms is depicted in FIG. 6. In FIG. 6, the vertical axis represents optical output (W), and the horizontal axis represents time (ns; nanosecond).

It can be found from FIG. 6 that the semiconductor laser 13 emits light of a short pulse having a very short pulse width equal to or smaller than 0.02 ns.

Figure 7:
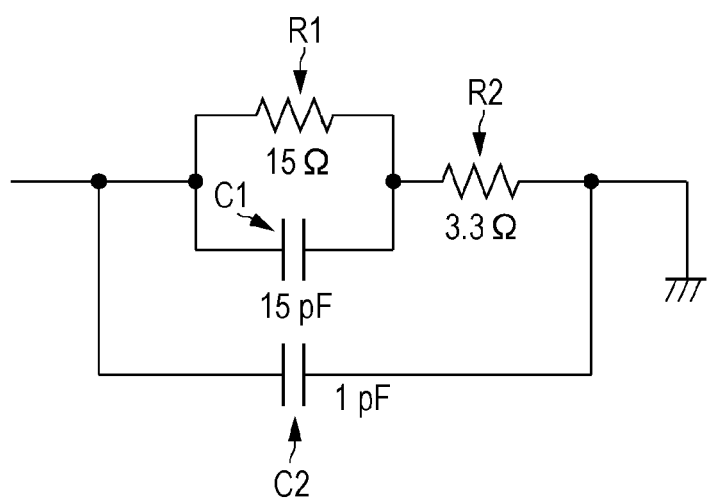
FIG. 7 is a diagram of an example of an equivalent circuit when the semiconductor laser is in an ON state.

Also, an equivalent circuit when the semiconductor laser is in an ON state can be represented as in FIG. 7 by using passive elements, that is, a resistor and a capacitor.

In FIG. 7, by way of example, numerical values of resistances and capacitances when a blue-violet laser diode (SLD-3233) manufactured by Sony Corporation are shown.

As depicted in FIG. 7, a first resistor R1 having a resistance value of 15Ω and a first capacitance C1 having a capacitance of 15 pF are connected in parallel to each other. To these components, a second resistor R2 having a resistance value of 3.3Ω is connected in series. Furthermore, to these components, a second capacitance C2 having a capacitance of 1 pF is connected in parallel.

Here, when the semiconductor laser is in an OFF state, the resistance value of the first resistor R1 is increased to be several kΩ, and the impedance of the entire semiconductor laser is increased accordingly.

That is, the impedance of the semiconductor laser is changed depending on whether the semiconductor laser is in an ON state or an OFF state.

As for the laser device depicted in FIG. 5, a monitor signal S4 was observed with the oscilloscope 45.

Also, for comparison, the monitor signal S4 was similarly observed with the oscilloscope 45 also when the RF amplifier 12 and the semiconductor laser 13 of the laser device depicted in FIG. 5 were directly connected to each other without the control circuit unit 21.

In either structure, the short-pulse signal S1 was set to have a repetition frequency of 200 MHz and a pulse width of 0.5 ns. Also, the monitor signal S4 was observed when the short-pulse signal S1 was generated with a small amplitude so as not to cause the semiconductor laser 13 to emit light and when the short-pulse signal S1 was generated with a large amplitude for causing the semiconductor laser 13 to emit light.

Figure 8A:
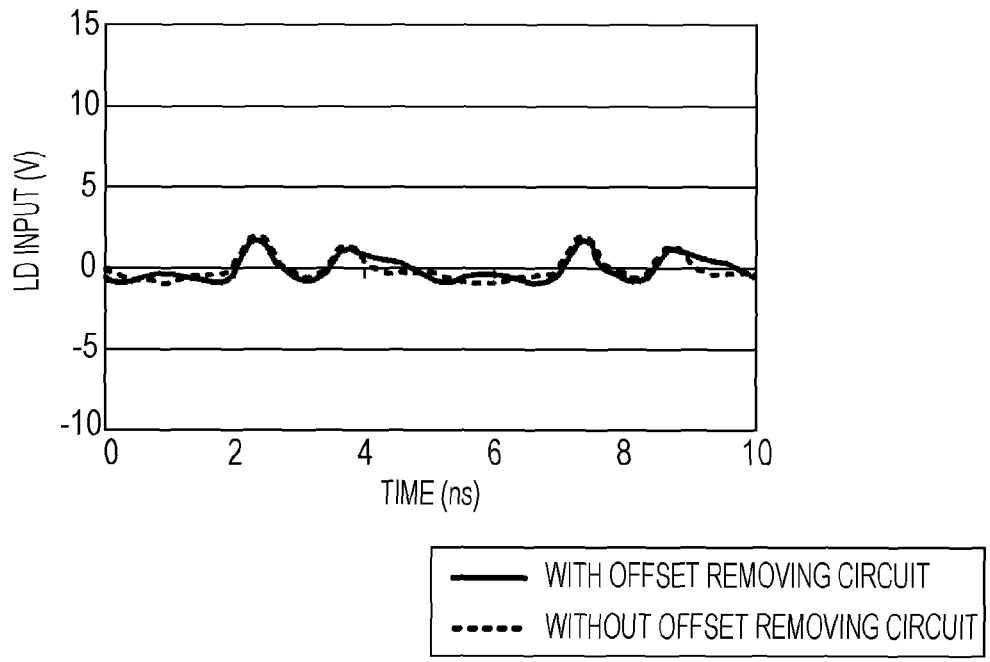
FIGS. 8A and 8B are graphs depicting observed monitor signals for comparison between a structure in which a control circuit unit is inserted and a structure in which a control circuit unit is not provided.
Figure 8B:
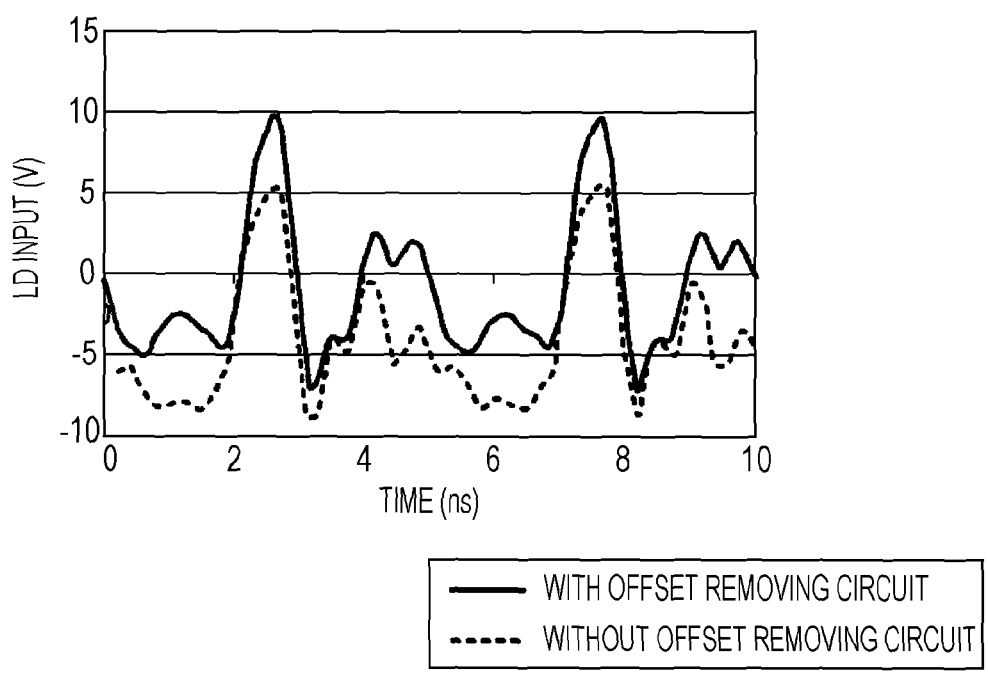

As the observation results, the observed monitor signal S4 in the structure in which the control circuit unit (offset removing circuit) 21 is inserted and the observed monitor signal S4 in the structure in which the RF amplifier 12 and the semiconductor laser 13 are directly connected to each other without the control circuit unit 21 are depicted for comparison in FIGS. 8A and 8B. FIG. 8A depicts the case where the amplitude of the short-pulse signal S1 is small, and FIG. 8B depicts the case where the amplitude of the short-pulse signal S1 is large.

Here, in FIGS. 8A and 8B, the vertical axis represents the observed monitor signal S4 as being converted to a voltage of a laser driving signal S2. Also, the monitor signal S4 includes not only the laser driving signal S2 but also a pulse reflected on the semiconductor laser 13, and the laser driving signal S2 corresponds to peaks near 2.5 ns and 7.5 ns.

With reference to FIG. 8A, when the amplitude of the short-pulse signal S1 is small and the semiconductor laser 13 is in a state of not emitting short-pulse light, no offset occurs in the average value of the laser driving signal S2 in both structures.

With reference to FIG. 8B, when the amplitude of the short-pulse signal S1 is increased, in the structure in which the control circuit unit (offset removing circuit) 21 is inserted, no offset occurs in the average value of the laser driving signal S2, and therefore the semiconductor laser 13 emits short-pulse light.

By contrast, in the structure in which the RF amplifier 12 and the semiconductor laser 13 are directly connected to each other, an offset occurs in the average value of the laser driving signal S2 to a negative voltage side and the peak voltage is decreased to approximately 5 V, and therefore the semiconductor laser 13 does not emit short-pulse light. Worse yet, since a counter voltage applied to the semiconductor laser is increased, thereby possibly degrading the semiconductor laser.

On the other hand, the monitor signal was similarly observed with the semiconductor laser 13 depicted in FIG. 5 being replaced by the equivalent circuit of the semiconductor laser depicted in FIG. 7.

Figure 9:
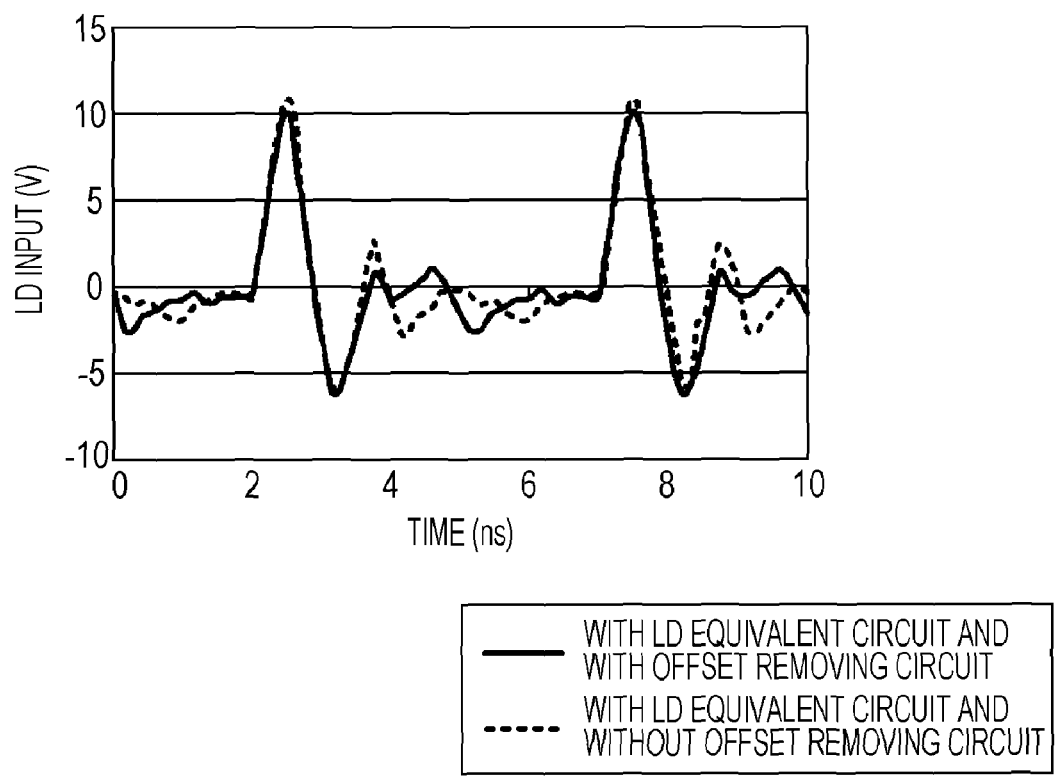
FIG. 9 is a graph depicting observed monitor signals for comparison between the structure in which a control circuit unit is inserted and the structure in which a control circuit unit is not provided, with the semiconductor laser of FIG. 5 being replaced by the equivalent circuit of FIG. 7.

The monitor signal observed in a manner similar to that of FIGS. 8A and 8B is depicted in FIG. 9.

With reference to FIG. 9, as with the state of no pulse light emission described above (refer to FIG. 8A), in both of the structure in which the control circuit unit (offset removing circuit) 21 is inserted and the structure in which the control circuit unit 21 is not inserted, no offset occurs in the average value of the laser driving signal S2.

From the results described above, it can be found that since the impedance sharply changes at the time of short-pulse light emission of the semiconductor laser, an offset occurs in the average value of the laser driving signal.

Here, in the laser device of the embodiments of the present application, when a pulse reflected on the semiconductor laser poses a problem as depicted in FIGS. 8A, 8B, and 9, an attenuator is provided at an appropriate position between the signal generating circuit and the semiconductor laser. With the provision of the attenuator, the short-pulse signal is also attenuated by the attenuator. In consideration of that attenuation, the amplitude of the pulse signal generated from the signal generating circuit is increased, or the amplification factor of the amplifying circuit, such as the RF amplifier, is increased.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A laser device comprising:
   a semiconductor laser;
   a signal generating circuit generating a pulse signal for driving the semiconductor laser;
   an amplifying circuit amplifying the pulse signal; and
   a control circuit unit provided between the amplifying circuit and the semiconductor laser and controlling the pulse signal by letting alternating-current components of the pulse signal pass through and removing at least part of direct-current components of the pulse signal; and
   wherein the control circuit unit includes a capacitor connected in series to the amplifying circuit and the semiconductor laser and a coil connected to one end of the capacitor.

2. The laser device according to claim 1, further comprising a direct-current power supply unit applying a direct-current voltage to the control circuit unit from outside of the control circuit unit.

3. A laser device comprising:
   a semiconductor laser;
   a signal generating circuit generating a pulse signal for driving the semiconductor laser;
   an amplifying circuit amplifying the pulse signal; and
   a control circuit unit provided between the amplifying circuit and the semiconductor laser and controlling the pulse signal by letting alternating-current components of the pulse signal pass through and removing at least part of direct-current components of the pulse signal; and
   wherein the control circuit unit includes a capacitor connected in series to the amplifying circuit and the semiconductor laser and a coil connected to one end of the capacitor,
   wherein in the control circuit unit, all of the direct-current components of the pulse signal are removed, and an average value of the pulse signal is controlled to be 0.

* * * * *